US009768171B2

(12) United States Patent
Bao et al.

(10) Patent No.: US 9,768,171 B2
(45) Date of Patent: Sep. 19, 2017

(54) METHOD TO FORM DUAL TIN LAYERS AS PFET WORK METAL STACK

(71) Applicant: International Business Machines Corporation, Armonk, NY (US)

(72) Inventors: Ruqiang Bao, Wappingers Falls, NY (US); Siddarth A. Krishnan, Newark, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/970,943

(22) Filed: Dec. 16, 2015

(65) Prior Publication Data
US 2017/0179125 A1    Jun. 22, 2017

(51) Int. Cl.
| | | |
|---|---|---|
| H01L 27/092 | (2006.01) |
| H01L 29/40 | (2006.01) |
| H01L 21/28 | (2006.01) |
| H01L 29/49 | (2006.01) |
| H01L 21/285 | (2006.01) |
| H01L 21/8238 | (2006.01) |

(52) U.S. Cl.
CPC ...... *H01L 27/092* (2013.01); *H01L 21/28088* (2013.01); *H01L 21/28556* (2013.01); *H01L 21/823828* (2013.01); *H01L 29/401* (2013.01); *H01L 29/4966* (2013.01)

(58) Field of Classification Search
CPC ........... H01L 27/092; H01L 21/823828; H01L 21/28556; H01L 29/401; H01L 29/4966
See application file for complete search history.

(56) References Cited

U.S. PATENT DOCUMENTS

| | | | | |
|---|---|---|---|---|
| 2002/0155219 A1* | 10/2002 | Wang | ...................... | C23C 16/34 427/255.391 |
| 2004/0104439 A1* | 6/2004 | Haukka | ............. | H01L 21/28088 257/368 |
| 2004/0106249 A1* | 6/2004 | Huotari | ............. | H01L 21/28088 438/216 |
| 2007/0018259 A1* | 1/2007 | Ko | ...................... | H01L 27/0922 257/410 |

(Continued)

OTHER PUBLICATIONS

Chen, Chien-Liang, et al.; "TiN Metal Gate Electrode Thickness Effect on BTI and Dielectric Breakdown in HfSiON-Based MOSFETs"; IEEE Transaction on Electron Devices; vol. 58, No. 11; p. 3736-3742; Nov. 2011.

(Continued)

*Primary Examiner* — Christine Enad
(74) *Attorney, Agent, or Firm* — Cantor Colburn LLP; Jennifer Anda

(57) ABSTRACT

A method of making a semiconductor device includes growing an interfacial layer on a substrate; depositing a first titanium nitride (TiN) layer on the interfacial layer; depositing a second TiN layer on the first TiN layer, the first TiN layer and the second TiN layer forming a bilayer work function gate stack of a first transistor; depositing a work function gate stack of a second transistor on the interfacial layer adjacent to the bilayer work function gate stack and on the bilayer work function stack; and depositing a gate electrode material on the work function gate stack of the second transistor.

6 Claims, 7 Drawing Sheets

(56) References Cited

U.S. PATENT DOCUMENTS

| | | | |
|---|---|---|---|
| 2008/0203488 A1* | 8/2008 | Chung | H01L 21/28088 |
| | | | 257/369 |
| 2010/0258881 A1* | 10/2010 | Chudzik | H01L 21/28185 |
| | | | 257/410 |
| 2010/0304567 A1 | 12/2010 | Sakai et al. | |
| 2012/0080756 A1 | 4/2012 | Suzuki et al. | |
| 2014/0077313 A1 | 3/2014 | Li et al. | |
| 2014/0131809 A1* | 5/2014 | Ando | H01L 21/02697 |
| | | | 257/369 |
| 2014/0319616 A1* | 10/2014 | Baudot | H01L 21/28079 |
| | | | 257/369 |
| 2015/0132938 A1 | 5/2015 | Ahmed et al. | |

OTHER PUBLICATIONS

Sasaki, Takaoki, et al.; "Effect of Fluorine on Interface Characteristics in Low-Temperature CMIS Process with HfO2 Metal Gate Stacks"; Japanese Journal of Applied Physics; vol. 44, No. 4B; p. 2252-2256; 2005.

* cited by examiner

US 9,768,171 B2

METHOD TO FORM DUAL TiN LAYERS AS PFET WORK METAL STACK

BACKGROUND

The present invention relates to complementary metal oxide semiconductor (CMOS), and more specifically, to gate stack materials.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

When a MOSFET is scaled down through various technology nodes, several techniques are employed to improve device performance. In sub-micrometer devices, nitrogen may be incorporated into the silicon gate oxide to reduce the gate leakage current density and prevent boron penetration. High-k metal gate stacks also may be used as an alternative to improve the gate current density for a given equivalent oxide thickness.

SUMMARY

According to an embodiment, a method of making a semiconductor device includes growing an interfacial layer on a substrate; depositing a first titanium nitride (TiN) layer on the interfacial layer; depositing a second TiN layer on the first TiN layer, the first TiN layer and the second TiN layer forming a bilayer work function gate stack of a first transistor; depositing a work function gate stack of a second transistor on the interfacial layer adjacent to the bilayer work function gate stack and on the bilayer work function stack; and depositing a gate electrode material on the work function gate stack of the second transistor.

According to another embodiment, a method of making a semiconductor device includes growing an interfacial layer on a substrate; depositing an n-type work function gate stack of an nFET on the interfacial layer; depositing a bilayer work function gate stack of a pFET on the interfacial layer adjacent to the n-type work function gate stack, the bilayer work function gate stack comprising a first titanium nitride (TiN) layer arranged on the interfacial layer and a second TiN layer arranged on the first TiN layer; and depositing a gate electrode material on the bilayer work function gate stack.

Yet, according to another embodiment, a semiconductor device includes an interfacial layer arranged on a substrate; an n-type work function gate stack of an nFET arranged on the interfacial layer; a bilayer work function gate stack of a pFET arranged on the interfacial layer adjacent to the n-type work function gate stack, the bilayer work function gate stack comprising a first titanium nitride (TiN) layer arranged on the interfacial layer and a second TiN layer arranged on the first TiN layer; and a gate electrode material arranged over the n-type work function gate stack and the bilayer work function gate stack.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1-5 illustrate exemplary methods of making semiconductors devices according to an embodiment, in which:

FIG. 1 is a cross-sectional side view of an interfacial layer arranged on a substrate;

FIG. 2 is a cross-sectional side view after depositing a bilayer TiN stack on the interfacial layer;

FIG. 3 is a cross-sectional side view after removing the bilayer TiN stack from a first transistor area of the substrate;

FIG. 4 is a cross-sectional side view after depositing the second work function gate stack of a second transistor;

FIG. 5 is a cross-sectional side view after depositing a conductive gate electrode on the second work function gate stack;

FIGS. 6-7 illustrate exemplary methods of making semiconductor devices according to another embodiment following FIG. 1, in which:

FIG. 6 is a cross-sectional side view after depositing a first work function gate stack material; and FIG. 7 is a cross-sectional side view after depositing the bilayer TiN stack adjacent to the first work function gate stack material and a conductive electrode material.

DETAILED DESCRIPTION

Figure 1:
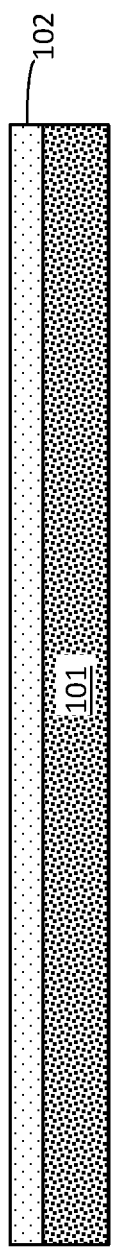

High temperature titanium nitride (TiN) derived from $TiCl_4$ precursors has low resistivity, which can improve gate resistance and thus device performance. However, one challenge of using high temperature TiN is that it may etch high-k layers, for example, $HfO_2$ and may enhance negative-bias temperature instability (NBTI) when it is as pFET work function metal. NBTI may reduce device reliability by increasing the threshold voltage and decreasing drain current and transconductance. Further, the breakdown voltage may also degrade with high temperature TiN made from $TiCl_4$ precursors because of the thinner high-k thickness.

Accordingly, various embodiments provide methods of making semiconductor devices with a lower temperature $TiCl_4$ derived TiN material in the pFET metal stack, which mitigates high-k loss and incorporates a certain amount of the NBTI beneficial element chlorine (Cl) into the high-k layer to improve device reliability. A two-layer TiN stack is described. The first TiN layer is a low temperature TiN film. The second TiN layer is deposited as a high temperature TiN film. The first TiN layer includes higher chlorine (Cl) content to be diffused into high-k to improve NBTI than the higher temperature second TiN layer.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Turning now to the Figures, FIGS. 1-5 illustrate exemplary methods of making semiconductor devices according to an embodiment. FIG. 1 is a cross-sectional side view of an interfacial layer 102 arranged on a substrate 101. The transistor may be a planar FET, FinFET, nanowiring FET, gate around FETs, or other device.

The substrate 101 may include one or more semiconductor materials. Non-limiting examples of substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. Other non-limiting examples of substrates 101 include silicon-on-insulator (SOI) substrates and silicon-germanium on insulator substrates with buried dielectric layers.

The interfacial layer 102 is grown on the substrate 101. The interfacial layer 102 may include a silicon oxide ($SiO_2$) layer. Alternatively, the interfacial layer 102 may optionally include $HfO_2$, HfSiO, SiON, or any combination thereof. The interfacial layer 102 may be formed by, for example, atomic layer deposition (ALD), chemical vapor deposition (CVD), thermal oxidation, wet oxidation, radical oxidation (RadOx), or combinations thereof.

After forming the interfacial layer 102, the interfacial layer 102 may be annealed to improve properties of the interfacial layer 102. The anneal process may performed inside a furnace or by performing a rapid thermal treatment in an atmosphere containing pure inert gases (e.g., nitrogen or argon). The anneal process may be, for example, a Rapid Thermal Anneal (RTA) or Rapid Thermal Processing (RTP).

Figure 2:
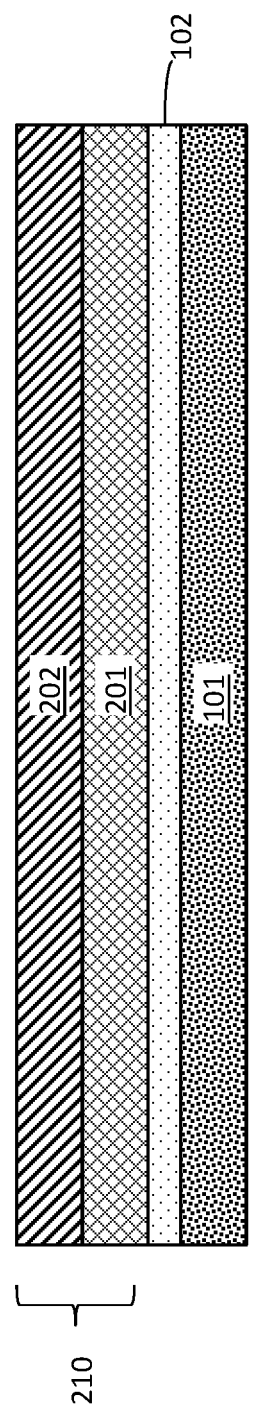

FIG. 2 is a cross-sectional side view after depositing a bilayer TiN stack 210 on the interfacial layer 102. The bilayer TiN stack 210 includes a first TiN layer 201 disposed on the interfacial layer 102 and a second TiN layer disposed on the first TiN layer 201.

The first TiN layer 201 and the second TiN layer 202 may be formed by, for example, chemical vapor deposition (CVD) or atomic layer deposition (ALD) using a mixture of $TiCl_4$ and $NH_3$ as a material precursor gases. The first TiN layer 201 is formed at a low deposition temperature and at a pressure in a range from about 1 to about 500 Torr. In some embodiments, the first TiN layer 201 is formed at a temperature in a range from about 200 to about 400° C. In other embodiments, the first TiN layer 201 is formed at a temperature in a range from about 320 to about 400° C.

By contrast, the second TiN layer 202 is deposited at a higher temperature than the first TiN layer 201 and at a pressure in a range from about 0.1 to about 500 Torr. The second TiN layer 202 may be deposited at a temperature in a range from about 400 to about 600° C. In other embodiments, the second TiN layer 202 may be deposited at a temperature in a range from about 400 to about 500° C.

Forming the first TiN layer 201 at lower temperature provides a TiN film that is rich in chlorine. The first TiN layer 201 has a different chlorine content than the first TiN layer 202, and in some embodiments, has a higher chlorine content than the second TiN layer 202. The higher chlorine content in the first TiN layer 201 at the interface with the interfacial layer 102 and the second TiN layer 202 reduces high-k loss and improves the NBTI because of the Cl incorporated into high-k due to the first lower temperature layer. The lower temperature first TiN layer 201 may include about 0.5 to about 5 atomic % (at. %) chlorine.

By contrast, the second TiN layer 202, formed at higher temperatures, includes less chlorine than the first TiN layer 201 in some embodiments, and is formed at a pressure in a range from 0.1 to about 500 Torr. In one embodiment, the second TiN layer 202 includes less than 0.5 at. % chlorine.

The higher temperature second TiN layer 202 lowers gate resistance and improves the device performance. Including the lower temperature first TiN layer 201 beneath the second TiN layer 202 prevents NBTI effects and dielectric breakdown.

Figure 3:
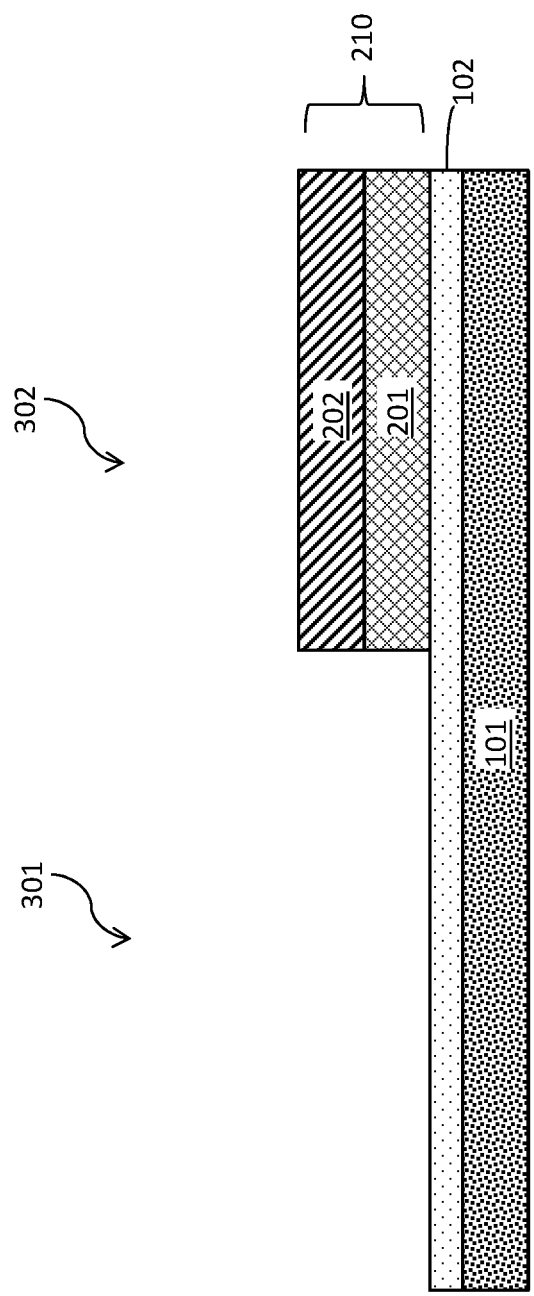

FIG. 3 is a cross-sectional side view after removing the bilayer TiN stack 210 from a first transistor 301 portion of the substrate 101. The bilayer TiN stack 210 forms a portion of the second transistor 302 gate stack (work function stack). In the exemplary embodiment, first transistor 301 is an nFET, the second transistor 302 is a pFET, and the bilayer TiN stack 210 forms a portion of the pFET work function gate stack. However, first transistor 301 and second transistor 302 are not limited to these types of transistors. In other exemplary embodiments, first transistor 301 may be a second transistor, and second transistor 302 may be a first transistor.

Lithography and etching, for example, reactive ion etch (RIE), is performed to confine the bilayer TiN stack 210 to the second transistor 302 portion of the substrate 101. In one non-limiting exemplary embodiment, a mask, such as a photoresist, is disposed on the bilayer TiN stack 210. The mask is patterned, for example, by exposure to a desired pattern of radiation, to create an opening over the first transistor 301. An etch process is performed to remove portions of the bilayer TiN stack 210 beneath the opening of the mask. Then the mask is removed.

In some embodiments, the thickness of the first TiN layer 201 is in a range from about 0.3 to about 5 nm. In other embodiments, the thickness of the second TiN layer 202 is in a range from about 0.5 to about 2 nm. Additional metals, for example, W, Co, Ru, Al, TiAl, and the like may be deposited on the second TiN layer 202 to improve pFET performance.

Figure 4:
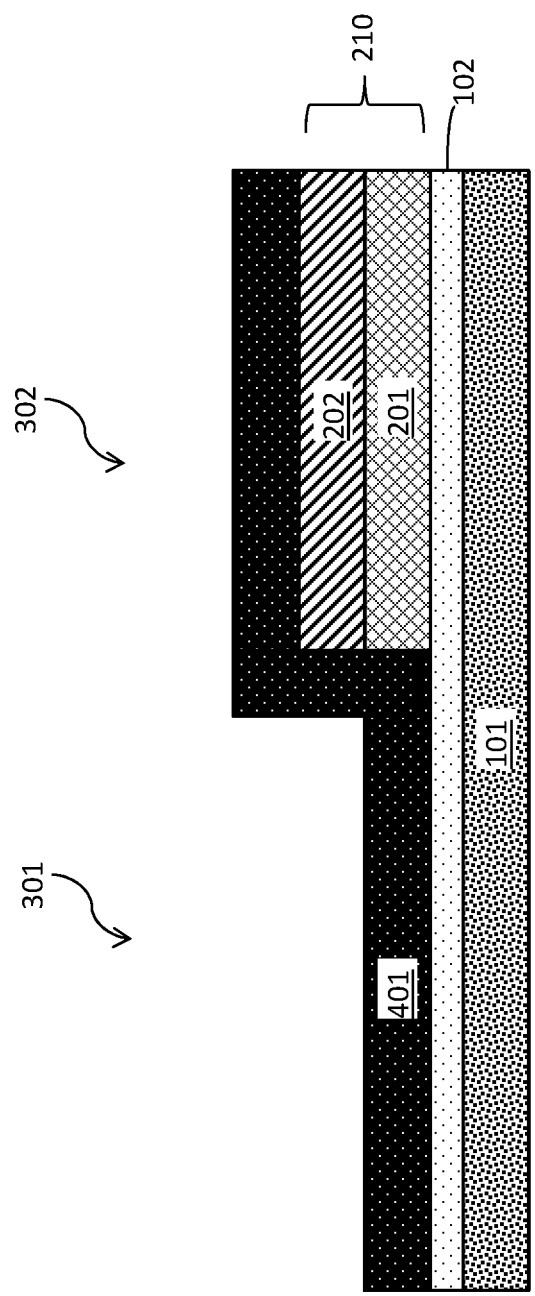

FIG. 4 is a cross-sectional side view after depositing a portion of the first transistor's 301 gate stack. When the first transistor 301 is an nFET, the gate stack 401 forms an nFET work function gate stack. The work function gate stack 401 is deposited on the interfacial layer 102 of the first transistor 301 and on the second TiN layer 202 of the second transistor 302. When first transistor 301 is an nFET, the gate stack 401 may include one or more n-type work function materials. The nFET metal gate stack 401 may include one metal layer, two metal layers, three metal layers, four metal layers, or more metal layers. N-type metal materials for the gate stack 401 include compositions that include hafnium, zirconium, titanium, tantalum, or aluminum metal carbides (e.g., hafnium carbide, zirconium carbide, titanium carbide, and aluminum carbide), aluminides, TiAl or any combination thereof.

Other examples materials for gate stack 401 include p-type work function materials, for example, compositions such as ruthenium, palladium, platinum, cobalt, nickel, and conductive metal oxides, or any combination thereof. The work function metal(s) may be deposited by a suitable deposition process, for example, CVD, PECVD, PVD, plating, thermal or e-beam evaporation, and sputtering.

In some embodiments, the thickness of the gate stack 401 of the first transistor 301 is in a range from about 1 to about 10 nm. In other embodiments, the thickness of the gate stack 401 of the first transistor 301 is in a range from about 2 to about 5 nm.

Figure 5:
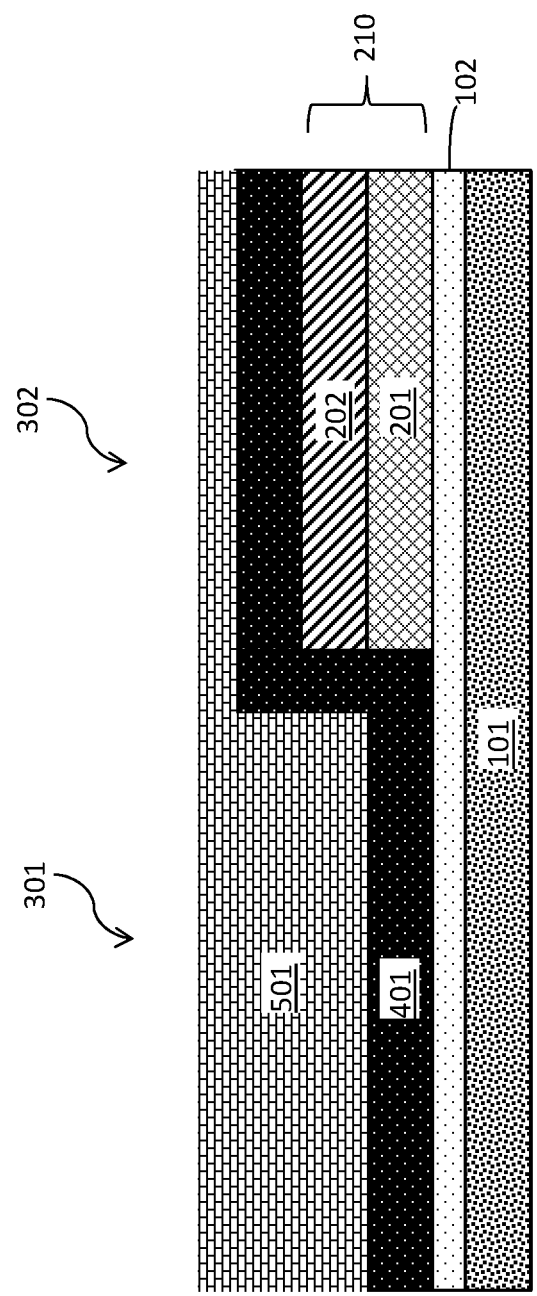

FIG. 5 is a cross-sectional side view after depositing a conductive gate electrode 501 material on the gate stack 401. The material forming the conductive gate electrode 501 may be a conductive gate metal(s). Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD,ALD, plating, thermal or e-beam evaporation, and sputtering. A planarization process, for example, chemical mechanical planarization (CMP), is performed to polish the surface of the conductive gate metal.

Figure 6:
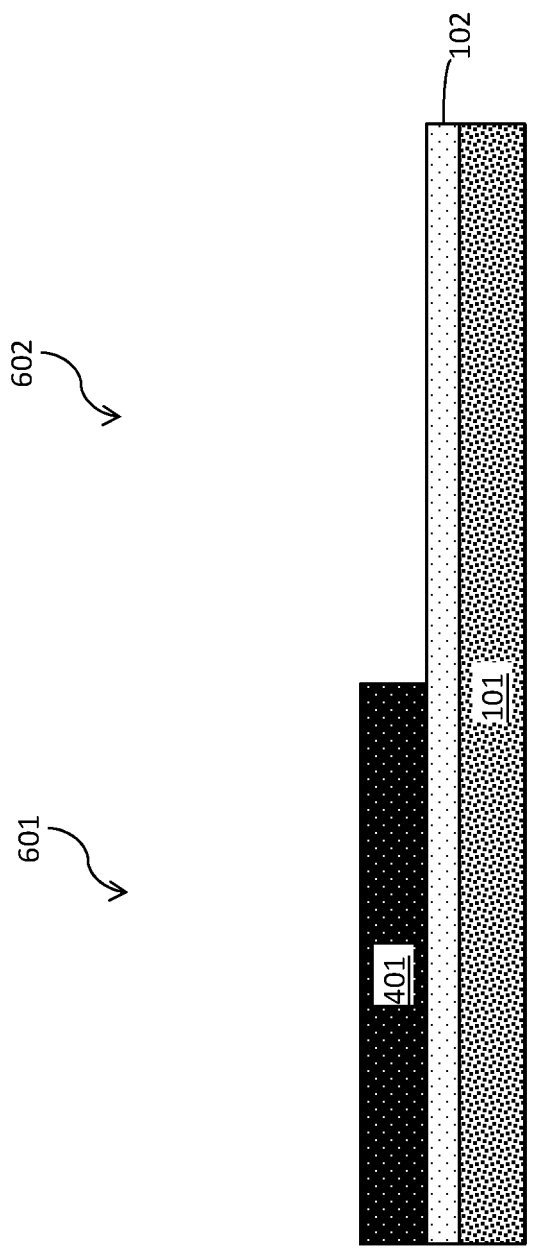
Figure 7:
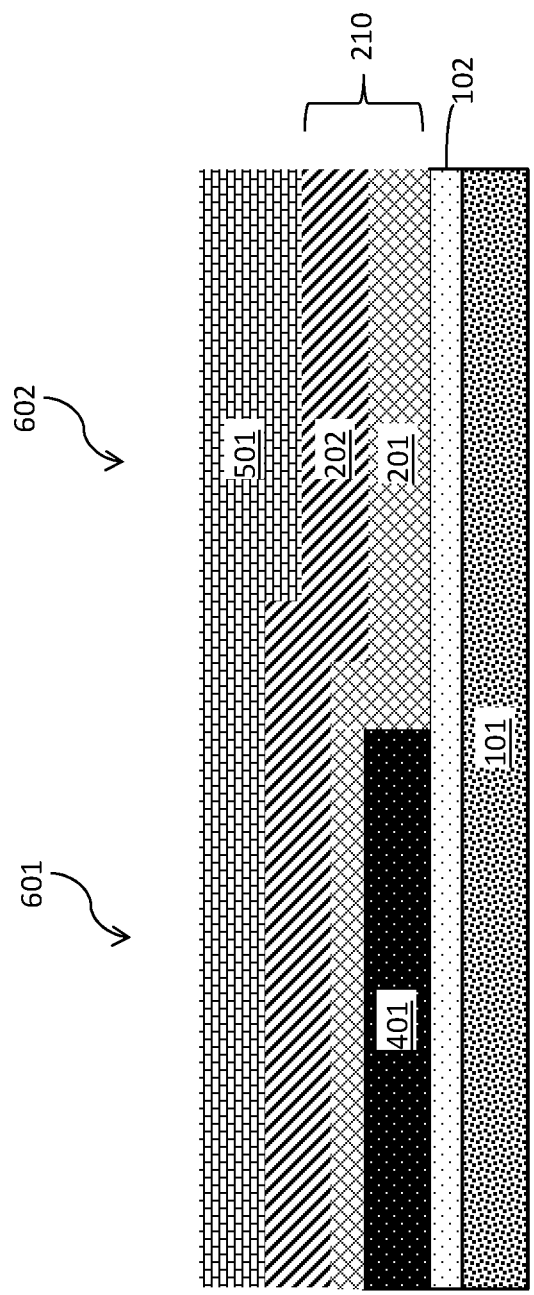

FIGS. 6-7 illustrate exemplary methods of making semiconductor devices according to another embodiment following FIG. 1. FIG. 6 is a cross-sectional side view after depositing a gate stack 401 (work function gate stack) of a first transistor 601 on the interfacial layer 102 arranged on a substrate 101, followed by lithography and etching, such as ME, to remove gate stack 401 material from the second transistor 602 area.

In the exemplary embodiment, first transistor 601 is an nFET, and second transistor 602 is a pFET. Although, first transistor 601 and second transistor 602 are not limited to these types of transistors.

When first transistor 601 is an nFET, the gate stack 401 may include one or more n-type work function metals. N-type metal materials for the gate stack 401 include compositions such as hafnium, zirconium, titanium, tantalum, or aluminum metal carbides (e.g., hafnium carbide, zirconium carbide, titanium carbide, and aluminum carbide), aluminides, or any combination thereof.

Other examples of materials for gate stack 401 include p-type work function materials, for example, compositions such as ruthenium, palladium, platinum, cobalt, nickel, and conductive metal oxides, or any combination thereof. The work function metal(s) may be deposited by a suitable deposition process, for example, CVD, PECVD, PVD, plating, thermal or e-beam evaporation, and sputtering.

FIG. 7 is a cross-sectional side view after depositing the bilayer TiN stack 210 and conductive electrode 501. The bilayer TiN stack 210 includes a first TiN layer 201 disposed on the interfacial layer 102 and a second TiN layer disposed on the first TiN layer 201.

In the first transistor 601, the first TiN layer 201 contacts the gate stack 401, and the second TiN layer 202 is arranged on the first TiN layer 201. In the second transistor 602, the first TiN layer 201 contacts the interfacial layer 102, and the second TiN layer 202 is arranged on the first TiN layer 202.

A conductive gate electrode 501 is deposited on the second TiN layer 202 of the bilayer TiN stack 210. The bilayer work function gate stack is also disposed between gate stack 401 and the conductive gate electrode 501 material of the first transistor 601. The material forming the conductive gate electrode 501 may be a conductive gate metal. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

As described above, various embodiments provide methods of making semiconductor devices with a lower temperature $TiCl_4$ derived TiN material in the pFET metal stack, which mitigates high-k loss, improves device reliability, and lowers gate resistance. A two layer TiN stack is described. The first TiN layer is a low temperature TiN film. The second TiN layer is deposited as a high temperature TiN film. The first TiN layer includes higher chlorine (Cl) content than the higher temperature second TiN layer, which can also improve NBTI.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
   growing an interfacial layer on a substrate;
   depositing an n-type work function gate stack of an nFET comprising an n-type work function metal directly on the interfacial layer;
   depositing, directly on the interfacial layer and directly on the n-type work function gate stack, a first titanium nitride (TiN) layer at a temperature in a range from about 200 to about 400° C. and a pressure in a range from about 1 to about 500 Torr to form a layer comprising about 0.5 to about 5 atomic % (at. %) chlorine;

depositing, directly on the first TiN layer, a second TiN layer at a temperature in a range from about 400 to about 600° C. and a pressure in a range from about 0.1 to about 500 Torr to form a layer comprising chlorine in an amount that is less than 0.5 at. % chlorine, the first TiN layer and the second TiN layer forming a bilayer work function gate stack of a pFET; and depositing a gate electrode material directly on the bilayer work function gate stack.

2. The method of claim 1, wherein the first TiN layer is deposited using chemical vapor deposition (CVD) or atomic layer deposition (ALD).

3. The method of claim 1, wherein the thickness of the first TiN layer is in a range from about 0.3 to about 5 nanometers (nm).

4. The method of claim 1, wherein the thickness of the second TiN layer is in a range from about 0.5 to about 2 nm.

5. The method of claim 1, wherein the bilayer work function gate stack is also disposed between the n-type work function gate stack and the gate electrode material.

6. The semiconductor device of claim 1, wherein the interfacial layer is $SiO_2$, $HfO_2$, or a combination thereof.

* * * * *